US010796880B2

(12) United States Patent
Nishimoto et al.

(10) Patent No.: US 10,796,880 B2
(45) Date of Patent: Oct. 6, 2020

(54) CHARGED PARTICLE BEAM DEVICE AND CHARGED PARTICLE BEAM DEVICE NOISE SOURCE DETERMINATION METHOD

(71) Applicant: HITACHI HIGH-TECHNOLOGIES CORPORATION, Minato-ku, Tokyo (JP)

(72) Inventors: Takuma Nishimoto, Tokyo (JP); Wen Li, Tokyo (JP); Hiroyuki Takahashi, Tokyo (JP); Wataru Mori, Tokyo (JP); Hajime Kawano, Tokyo (JP)

(73) Assignee: HITACHI HICH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/473,957

(22) PCT Filed: Dec. 27, 2016

(86) PCT No.: PCT/JP2016/088922
§ 371 (c)(1),
(2) Date: Jun. 26, 2019

(87) PCT Pub. No.: WO2018/122968
PCT Pub. Date: Jul. 5, 2018

(65) Prior Publication Data
US 2019/0341225 A1 Nov. 7, 2019

(51) Int. Cl.
*H01J 37/22* (2006.01)
(52) U.S. Cl.
CPC ....... *H01J 37/222* (2013.01); *H01J 2237/221* (2013.01)
(58) Field of Classification Search
None
See application file for complete search history.

(56) References Cited

U.S. PATENT DOCUMENTS

2013/0301954 A1* 11/2013 Shirai ................... G06T 7/0004
382/280

FOREIGN PATENT DOCUMENTS

JP 5537448 B2 * 7/2014 ........... G06T 7/0004
JP 5537448 B2 7/2014

* cited by examiner

*Primary Examiner* — Andrew Smyth
(74) *Attorney, Agent, or Firm* — Miles & Stockbridge, P.C.

(57) ABSTRACT

Provided is a charged particle beam device to enable determination of a noise source of a charged particle beam device that can cause a noise frequency component superimposed on a measurement image. The charged particle beam device includes a unit that extracts information regarding a noise source. The unit that extracts information regarding a noise source includes: a control signal monitoring unit that observes a control signal of a control unit which controls an electron optical system of the charged particle beam device and outputs the observed signal; a first frequency conversion processing unit that executes frequency conversion processing on the signal output from the control signal monitoring unit; a second frequency conversion processing unit that executes frequency conversion processing on an image signal output from a detector of the electron optical system; and a frequency analysis and comparison processing unit that receives an output signal of the first frequency conversion processing unit and an image signal of the second frequency conversion processing unit, and associates a peak frequency of a superimposed noise of the image signal with a noise source of the control unit which generates a noise having a peak frequency corresponding to the peak frequency of the superimposed noise within the image signal.

10 Claims, 12 Drawing Sheets

[FIG. 1]
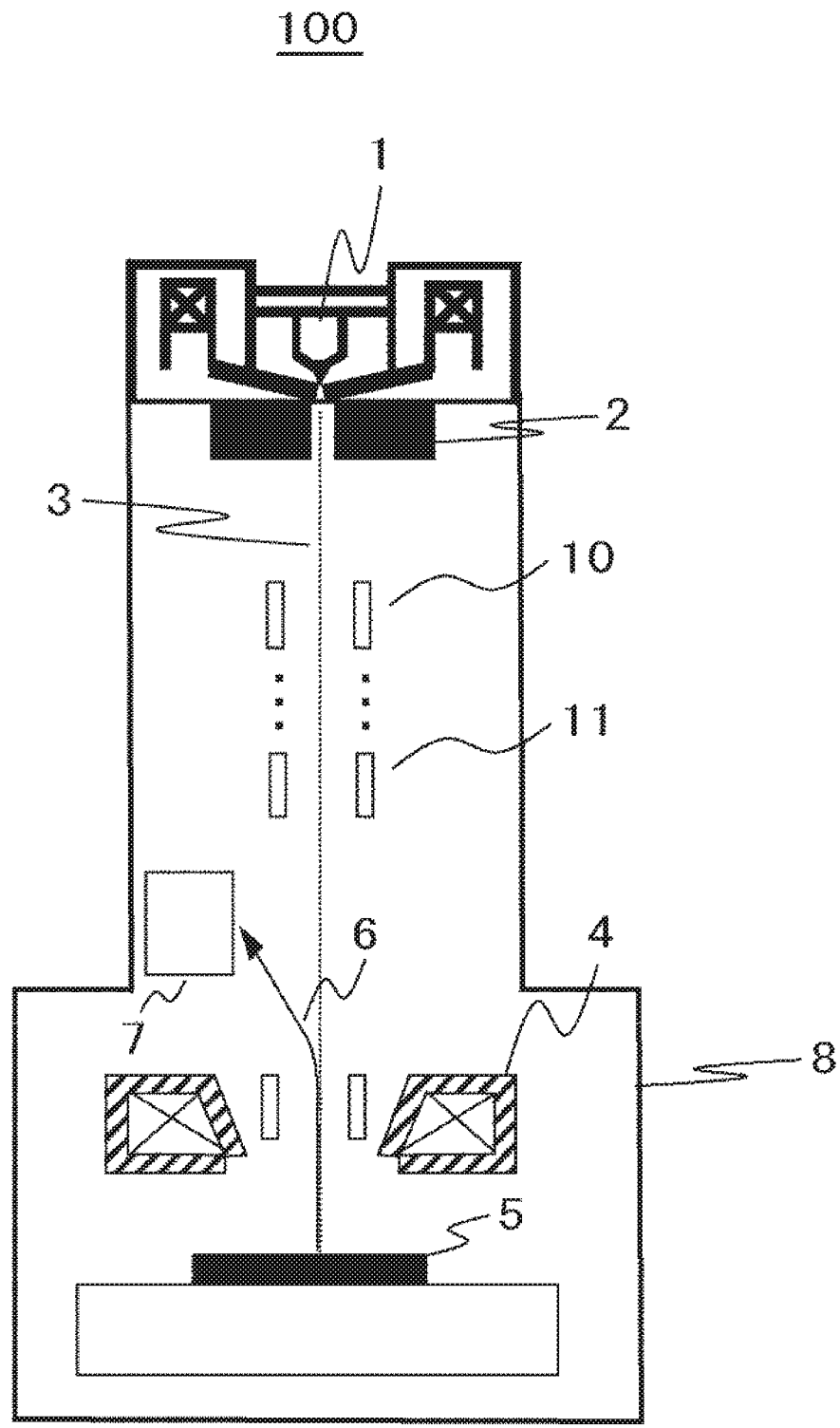

[FIG. 2]
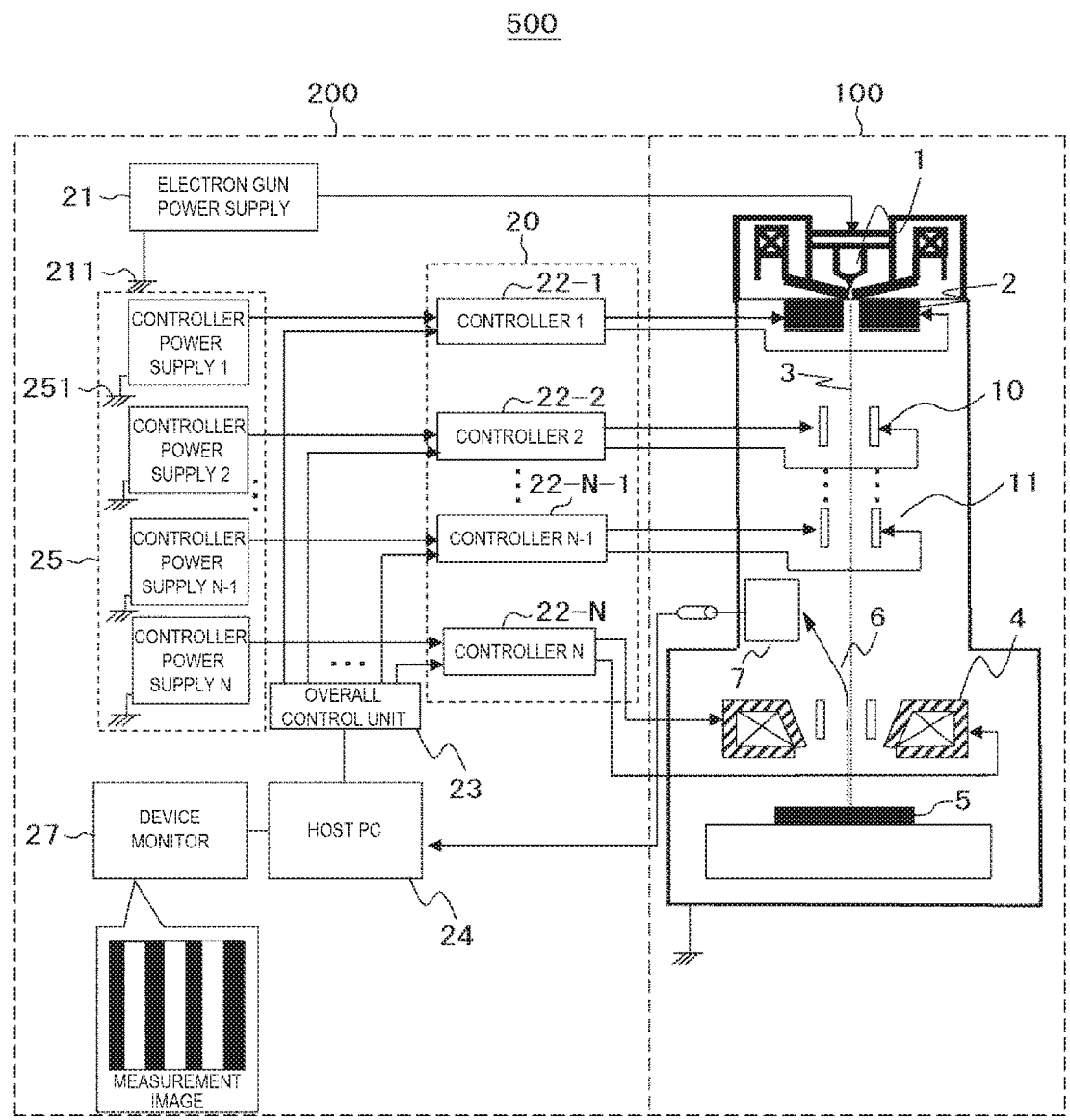

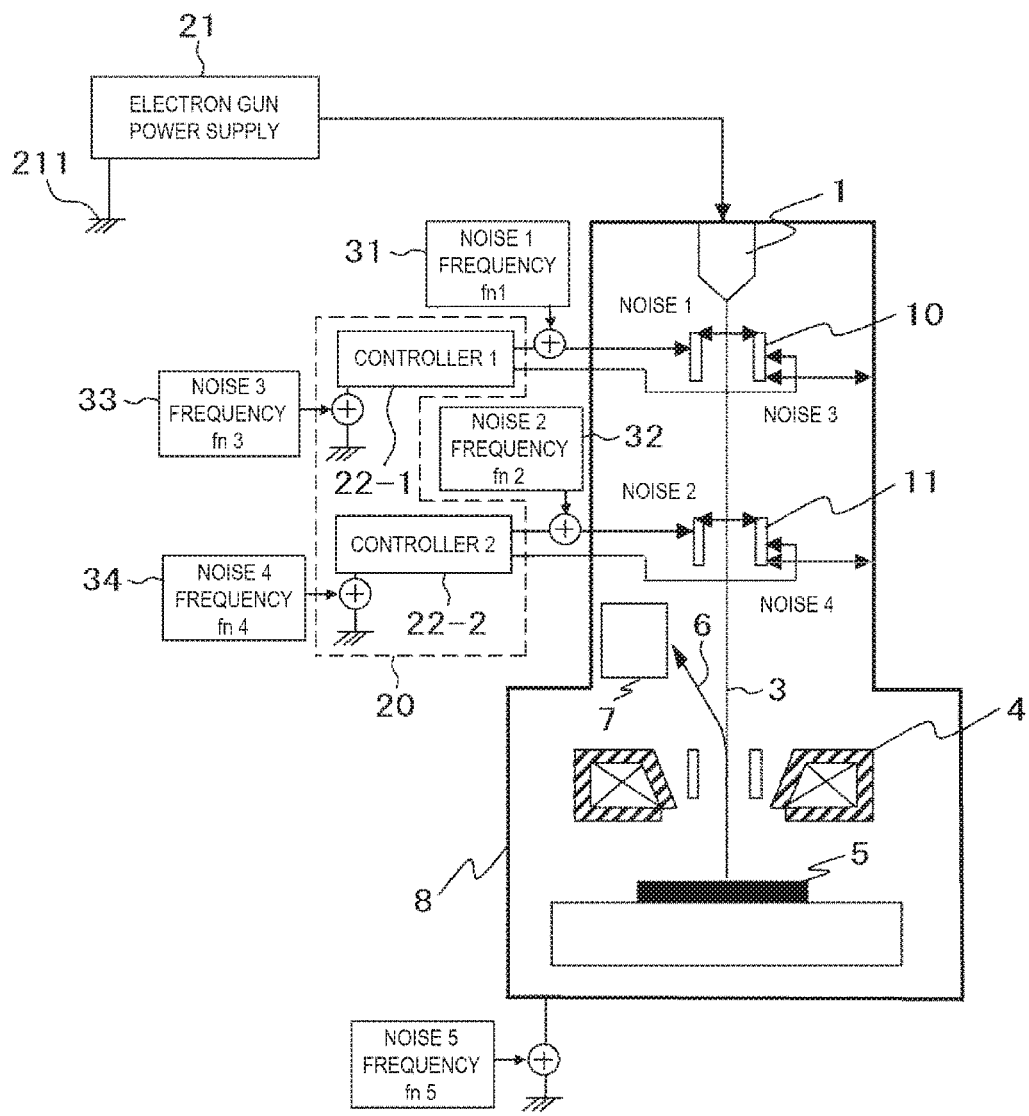
[FIG. 3]

[FIG. 4]
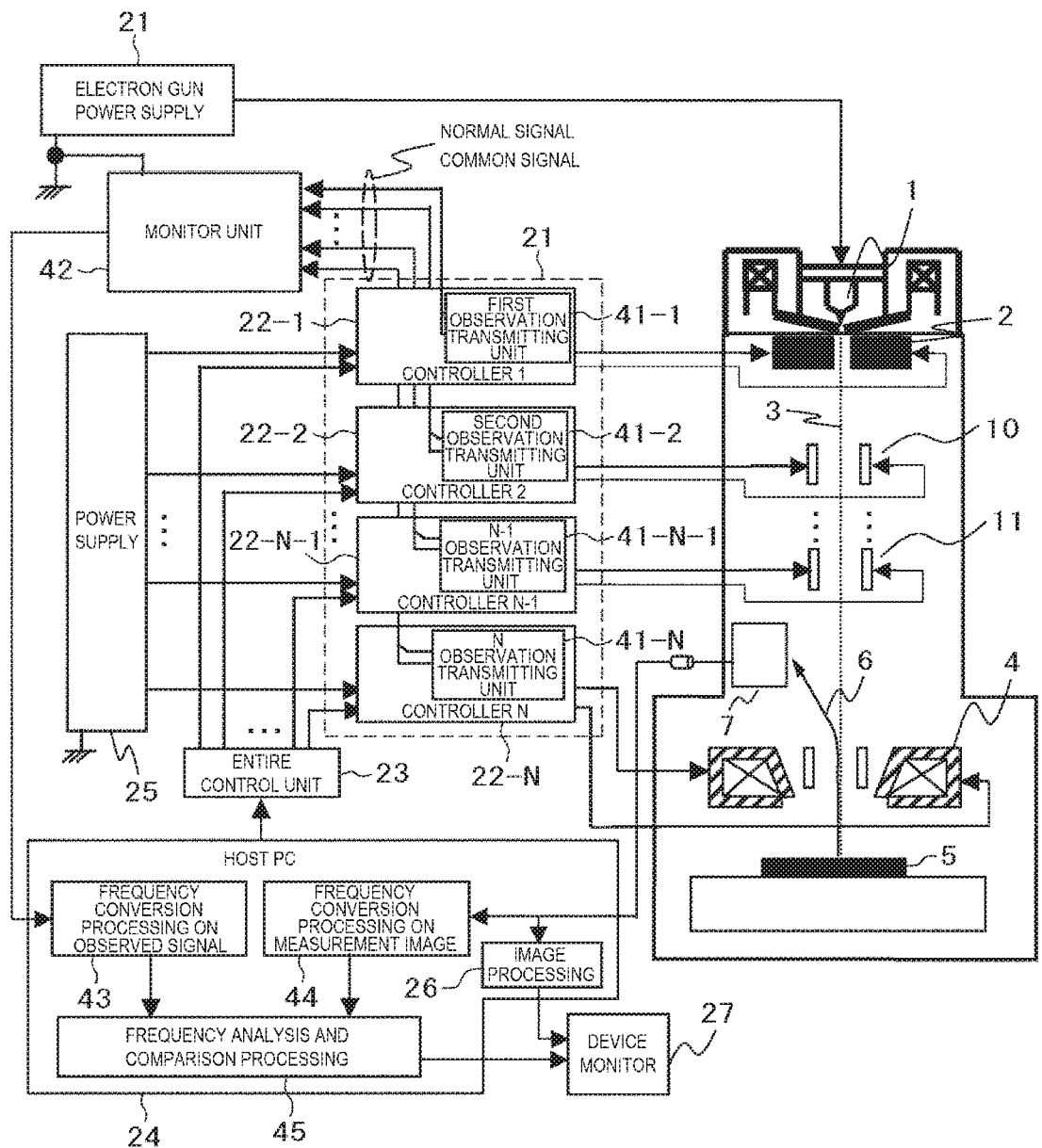

[FIG. 5]
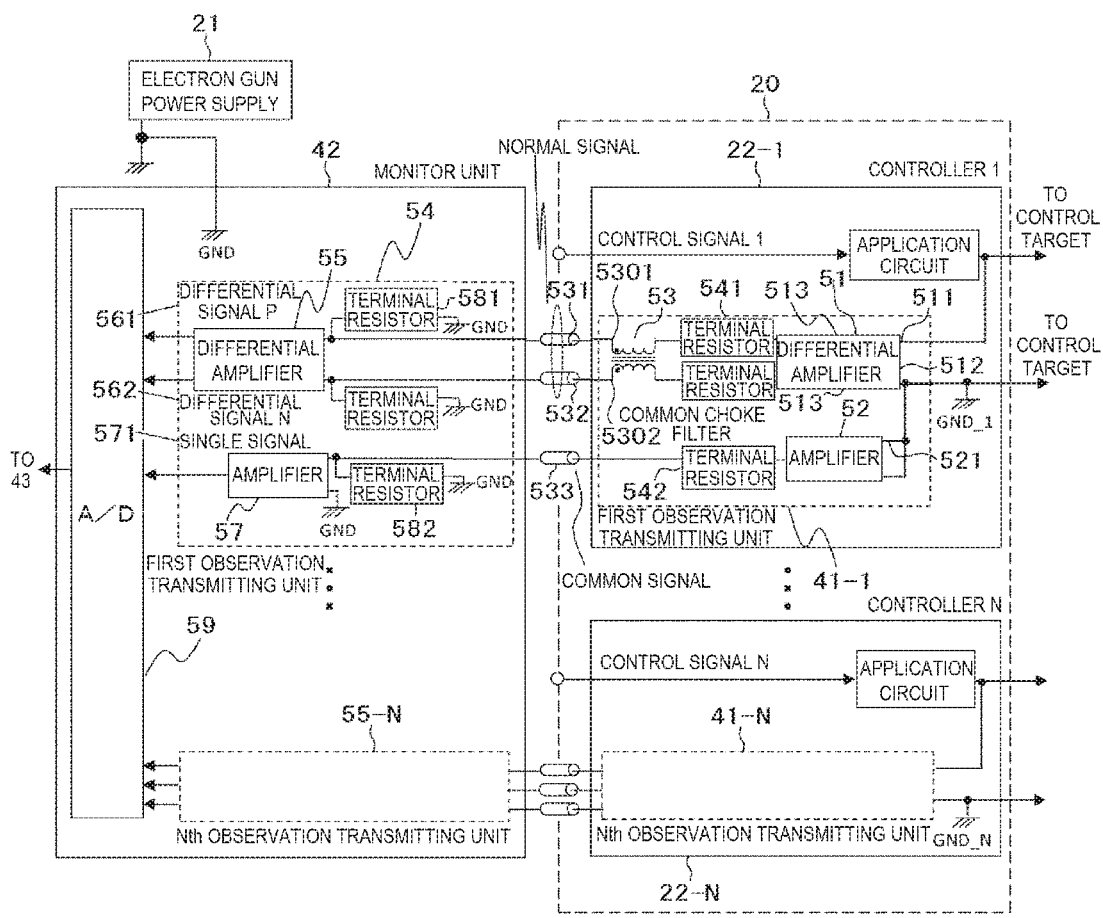

[FIG. 6]
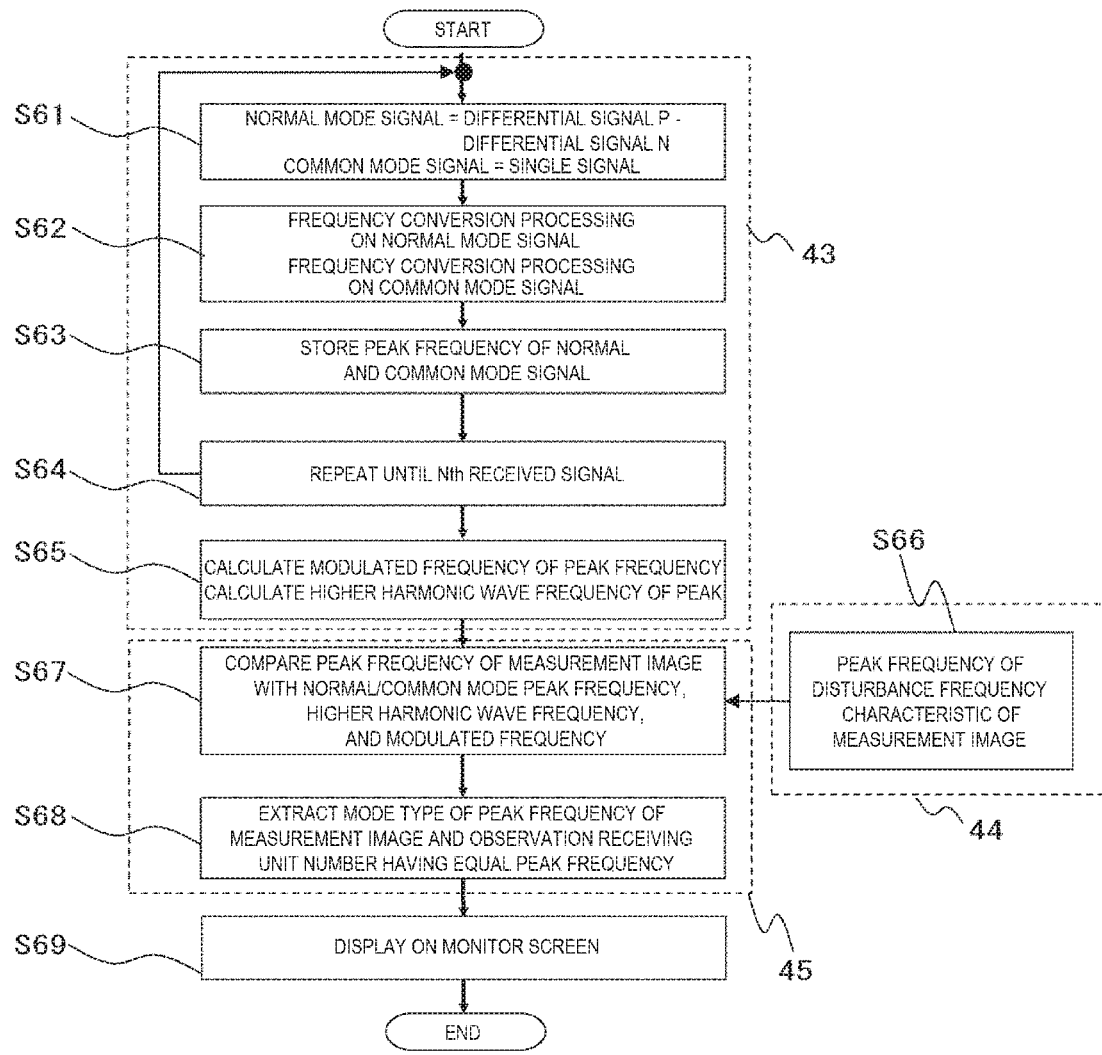

[FIG. 7]
| OBSERVATION RECEIVING UNIT No. | FREQUENCY CHARACTERISTIC OF NORMAL MODE SIGNAL | FREQUENCY CHARACTERISTIC OF COMMON MODE SIGNAL |
|---|---|---|
| 1 | 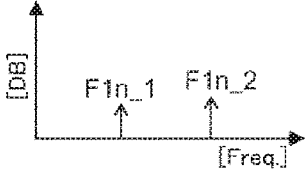 F1n_1, F1n_2 | 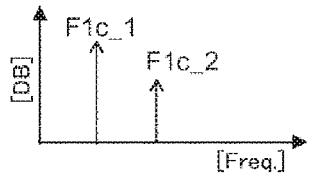 F1c_1, F1c_2 |
| 2 | 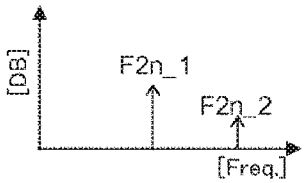 F2n_1, F2n_2 | 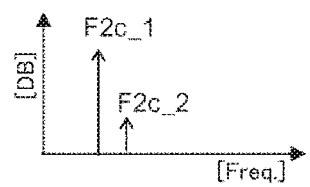 F2c_1, F2c_2 |
| ⋮ | | |
| N | 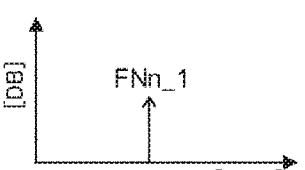 FNn_1 | 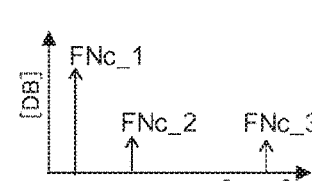 FNc_1, FNc_2, FNc_3 |

[FIG. 8]
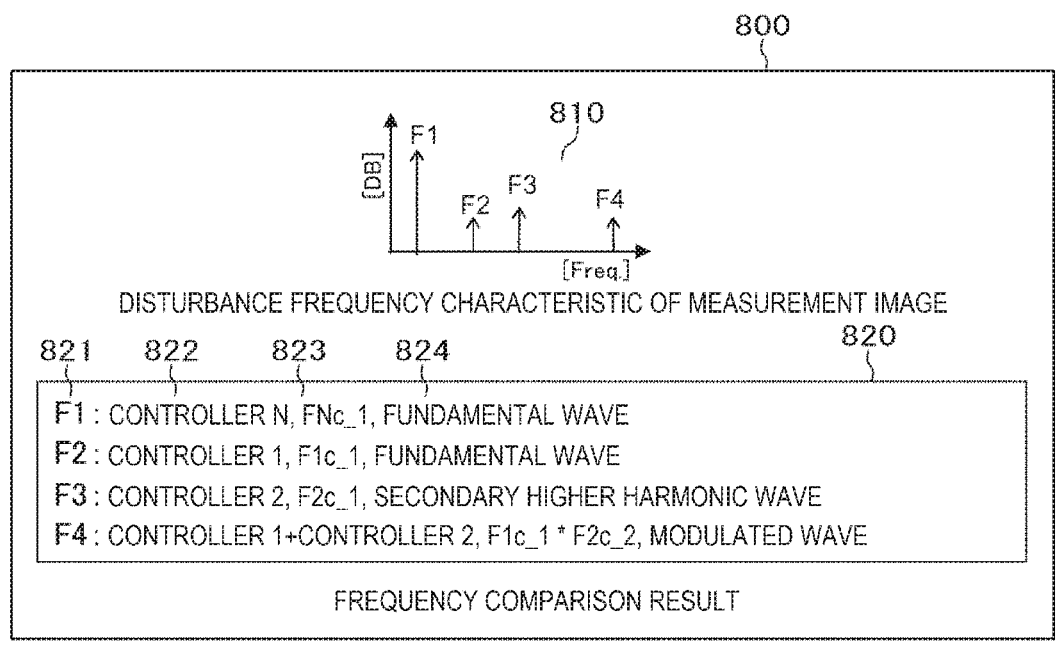
[FIG. 9]
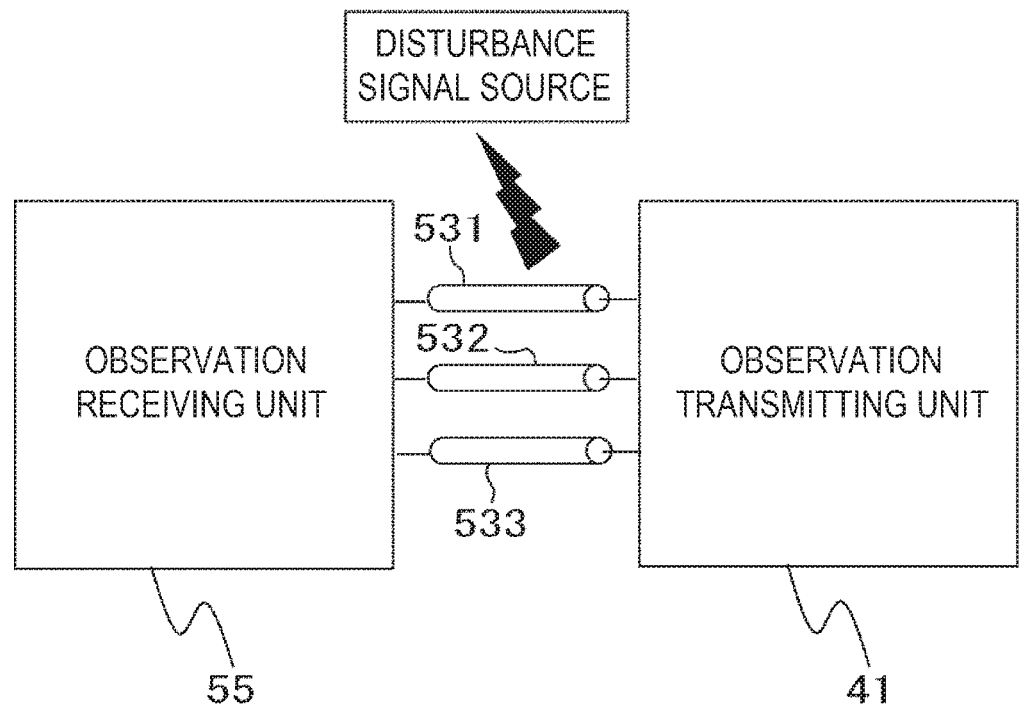

[FIG. 10]
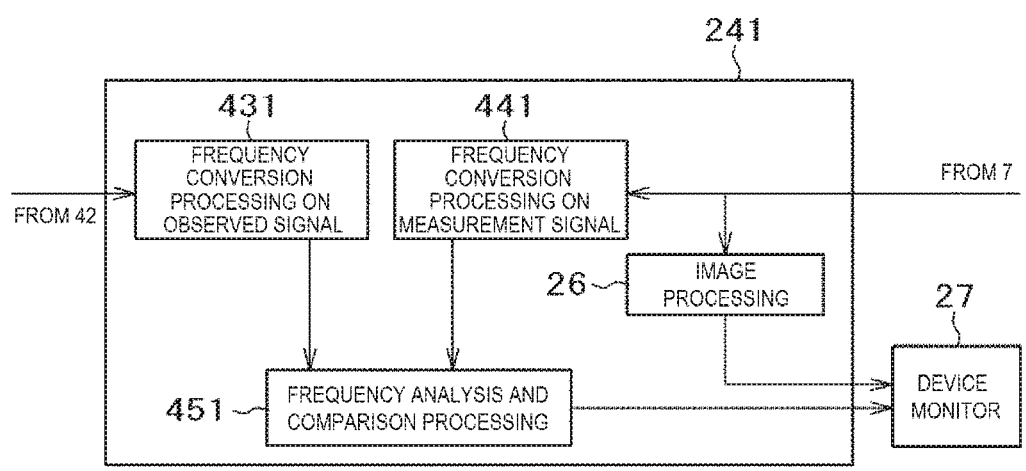

[FIG. 11]
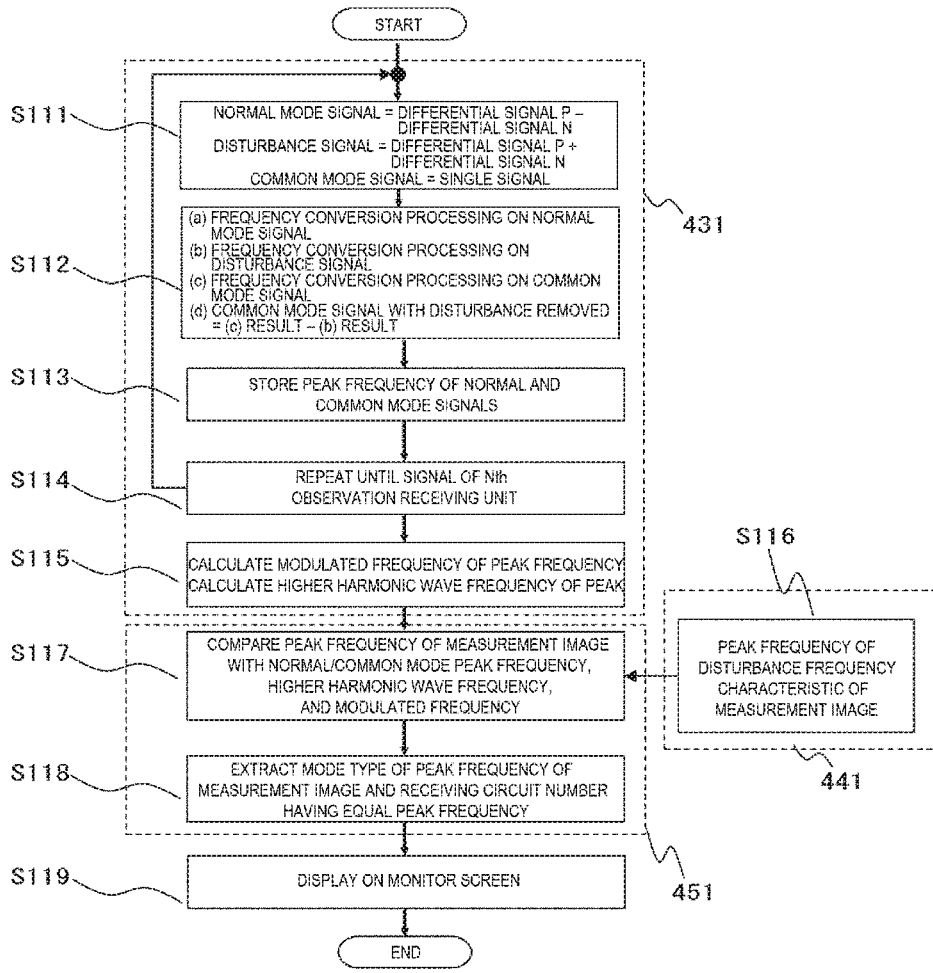
[FIG. 12A]
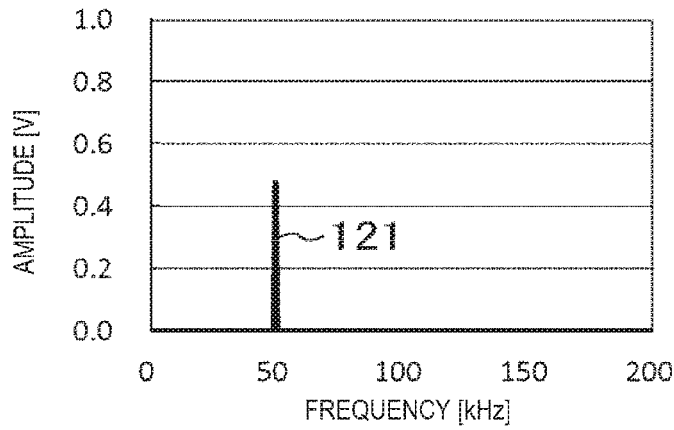
COMMON MODE NOISE CHARACTERISTIC

[FIG. 12B]
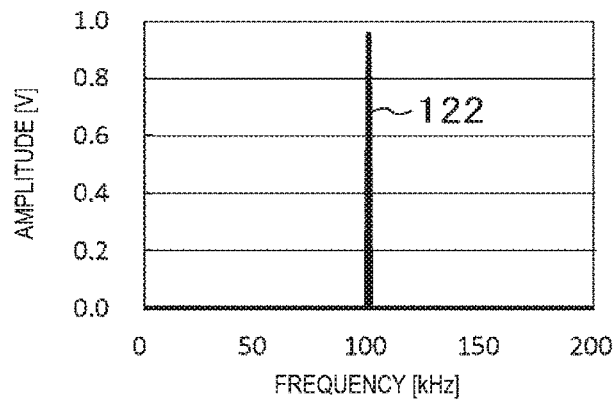
NORMAL MODE NOISE CHARACTERISTIC
[FIG. 12C]
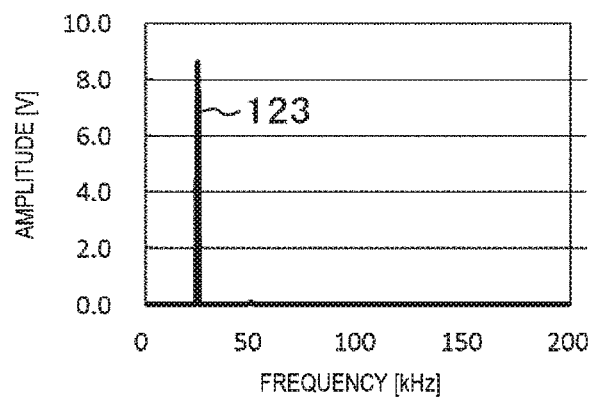
DISTURBANCE NOISE CHARACTERISTIC
[FIG. 12D]
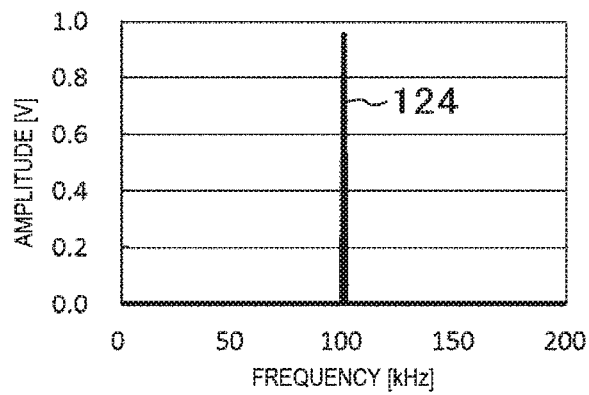
(a) NORMAL MODE DETECTION RESULT

[FIG. 12E]
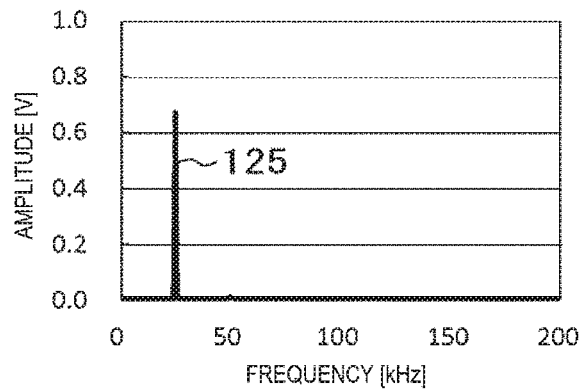
(b) DISTURBANCE SIGNAL DETECTION RESULT
[FIG. 12F]
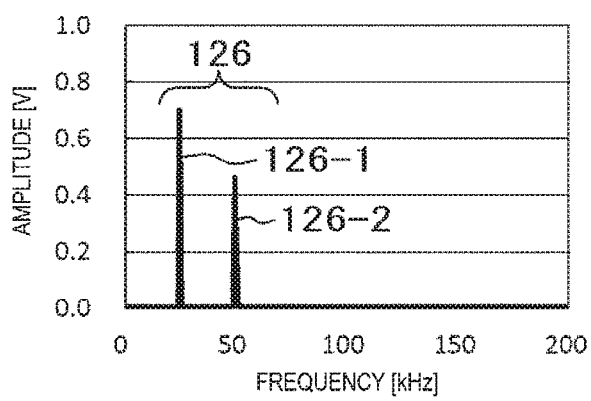
(c) COMMON MODE DETECTION RESULT
[FIG. 12G]
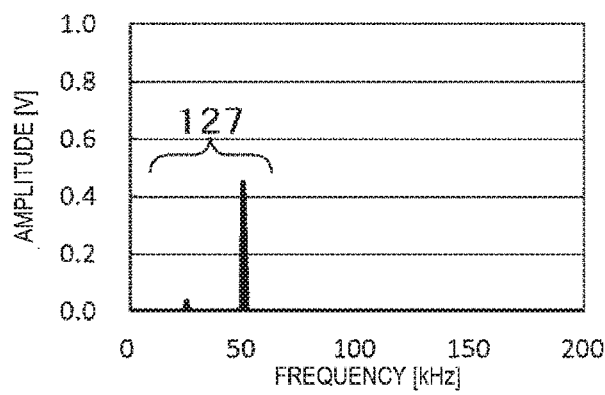
(d) COMMON MODE WITH DISTURBANCE REMOVED DETECTION RESULT

CHARGED PARTICLE BEAM DEVICE AND CHARGED PARTICLE BEAM DEVICE NOISE SOURCE DETERMINATION METHOD

TECHNICAL FIELD

The present invention relates to a charged particle beam device and a charged particle beam device noise source determination method.

BACKGROUND ART

Since an image acquired by a charged particle beam device contains noise components due to various factors, which hinders acquisition of a high quality image with increased resolution. With regard to reducing the noise components of the image, for example, Japanese Patent No. 5537448 (PLT 1) discloses a method of acquiring a frequency characteristic of a noise superimposed in a charged particle beam device from a measurement image.

That is, claim 1 of PLT 1 describes "a charged particle ray device that includes: a charged particle source; a deflector that scans a beam emitted from the charged particle source; and an arithmetic device that forms an image based on charged particles emitted from a sample, wherein the arithmetic device expands two-dimensionally a signal obtained when the deflector one-dimensionally scans the beam for a plurality of times to form a two-dimensional image, and executes a frequency analysis on waveform information showing an edge of the two-dimensional image" and claim 7 describes "the arithmetic device according to claim 1, wherein the arithmetic device executes the frequency analysis on the waveform information showing the edge of the two-dimensional image and controls the deflector to remove noise components detected based on the frequency analysis".

PRIOR ART LITERATURE

Patent Literature

PTL 1: Japanese Patent No. 5537448

SUMMARY OF INVENTION

Technical Problem

However, a plurality of controllers that respectively control electron optical devices such as a lens that focuses a charged particle beam, a deflection controller that controls a direction, and a blanking controller that cuts off irradiation of the charge particle beam to a sample of an observed target is installed on the charged particle beam device.

The controllers control a focal length or an irradiation direction of the charged particle beam by operating an electric field and a magnetic field. However, the focal length or the irradiation direction fluctuates because of an electrical noise superimposed on the controllers. As a result, blurring or positional deviation occurs in a measurement image, which is a main factor that leads to deterioration of image quality. Therefore, it is necessary to reduce noises in order to obtain a measurement image with high image quality. In view of the above problem, PLT 1 discloses a method of acquiring a frequency component of a superimposed noise from the measurement image.

The method disclosed in PLT 1, however, only discloses a fact that the frequency component of the noise is obtained and the deflector is adjusted to take a measure against a noise among a noise source caused by an electron optical system of the device. No consideration is taken to take a measure to determine the noise source from a plurality of candidates in the electron optical system.

In addition, when a noise of the plurality of controllers fluctuates in the charged particle beam, a lot of time is required to determine and measure the noise source since a modulation component of the noise becomes a noise frequency component of the measurement image.

Further, the noise frequency component may differs from one device to another, and accordingly execution is required for each device, which increases adjusting time after manufacture of the charged particle beam device, and further causes a decrease in maintainability.

Therefore, the invention solves the above-mentioned problems in the prior art and provides a charged particle beam device that includes a noise determination unit capable of clearly showing apart of the charged particle beam device that can cause a noise frequency component superimposed on a measurement image, and a charged particle beam device noise source determination method.

Solution to Problem

To solve the above-mentioned problems, the invention provides a charged particle beam device including a unit that extracts information regarding a noise source. The unit that extracts information regarding a noise source includes: a control signal monitoring unit that observes a control signal of a control unit which controls an electron optical system of the charged particle beam device and outputs the observed signal; a first frequency conversion processing unit that executes frequency conversion processing on the signal output from the control signal monitoring unit; a second frequency conversion processing unit that executes frequency conversion processing on an image signal output from a detector of the electron optical system of the charged particle beam device; and a frequency analysis and comparison processing unit that receives an output signal of the first frequency conversion processing unit and an image signal of the second frequency conversion processing unit and associates a peak frequency of a superimposed noise of the image signal with the noise source of the control unit which generates a noise having a peak frequency corresponding to the peak frequency of the superimposed noise within the image signal.

To solve the above-mentioned problems, the invention further provides a method of extracting information regarding a noise source of a charged particle beam device. The method includes: observing a control signal of a control unit that controls an electron optical system of the charged particle beam device; executing frequency conversion processing on the observed signal by a first frequency conversion processing unit; executing frequency conversion processing on an image signal output from a detector of the electron optical system of the charged particle beam device by a second frequency conversion processing unit; and receiving a result of the frequency conversion processing executed by the first frequency conversion processing unit and a result of the frequency conversion processing executed by the second frequency conversion processing unit, and associating a peak frequency of a superimposed noise of the image signal with a noise source of the control unit which generates a noise having a peak frequency corresponding to the peak frequency of the superimposed noise within the image signal by the frequency analysis and comparison processing unit.

Advantageous Effect

According to the invention, device adjusting time can be shortened and maintainability can be improved, and further a machine difference of the device can be confirmed by displaying correspondence between the noise of the controllers and the noise frequency superimposed in the measurement image.

Problems, configurations, and effects other than those described above will be clarified with the following description of embodiments.

BRIEF DESCRIPTION OF DRAWINGS

FIG. 1 is a block diagram showing a schematic configuration of a charged particle beam device body according to a first embodiment of the invention.

FIG. 2 is a block diagram showing a schematic configuration of a charged particle beam device system according to the first embodiment of the invention.

FIG. 3 is a schematic configuration diagram of the charged particle beam device system showing an example of a type of a noise generated in the charged particle beam device system according to the first embodiment of the invention.

FIG. 4 is a block diagram showing a detailed configuration of a control unit and a monitor unit in the charged particle beam device system according to the first embodiment of the invention.

FIG. 5 is a block diagram showing a detailed configuration of a noise determination unit in the charged particle beam device system according to the first embodiment of the invention.

FIG. 6 is a flowchart showing a processing flow of determining a noise generating source according to the first embodiment of the invention.

FIG. 7 is a diagram showing a relationship between a graph of a normal mode signal frequency characteristic and a graph of a common mode signal frequency characteristic in each observation receiving unit in the charged particle beam device system according to the first embodiment of the invention.

FIG. 8 is a front view of a display screen illustrating an example of a result of a noise source characteristic in the charged particle beam device system according to the first embodiment of the invention.

FIG. 9 is a block diagram of an observation transmitting unit and an observation receiving unit showing a state where a disturbance signal is placed on a signal line that connects the observation transmitting unit and the observation receiving unit in a charged particle beam device system according to a second embodiment of the invention.

FIG. 10 is a block diagram showing a configuration of a host PC in the charged particle beam device system according to the second embodiment of the invention.

FIG. 11 is a flowchart showing a processing flow of determining a noise generating source according to the second embodiment of the invention.

FIG. 12A is a graph showing a common mode noise waveform applied to controllers in the charged particle beam device system according to the second embodiment of the invention.

FIG. 12B is a graph showing a normal mode noise waveform applied to the controllers in the charged particle beam device system according to the second embodiment of the invention.

FIG. 12C is a graph showing a disturbance noise waveform applied to the controllers in the charged particle beam device system according to the second embodiment of the invention.

FIG. 12D is a graph showing a normal mode detection signal waveform obtained in step S111 of the flowchart shown in FIG. 11 in the charged particle beam device system according to the second embodiment of the invention.

FIG. 12E is a graph showing a disturbance signal waveform obtained in step S111 of the flowchart shown in FIG. 11 in the charged particle beam device system according to the second embodiment of the invention.

FIG. 12F is a graph showing a common mode detection signal waveform obtained in step S111 of the flowchart shown in FIG. 11 in the charged particle beam device system according to the second embodiment of the invention.

FIG. 12G is a graph showing a disturbance removed common mode detection signal waveform obtained in step S112 of the flowchart shown in FIG. 11 in the charged particle beam device system according to the second embodiment of the invention.

DESCRIPTION OF EMBODIMENTS

A charged particle beam device is widely used in length measurement and pattern inspection of a semiconductor wafer.

In recent years, with a refinement of a semiconductor process, it is necessary to improve a resolution of a measurement image, and it is required to reduce a noise of an electron optical device that generates, focuses, and deflects a charged particle beam.

On the other hand, a noise exists in a controller that controls the electron optical device, and the noise causes a deviation in a focus or an operational position of the charged particle beam, which is a main factor that leads to deterioration of the measurement image. A characteristic of the noise depends on an installation position of the controller, a method of wiring the controller and the electron optical device, a grounding method, and the like. In addition, a plurality of controllers is installed in the charged particle beam device, and the characteristic of the noise also changes due to interference between controllers.

Therefore, when the noise causes deterioration of the measurement image, it takes a lot of time to determine and measure a noise source, which increases time to adjust the charged particle beam device after manufacture, and further causes a decrease in maintainability. Therefore, a method capable of determining the noise source which causes deterioration of image quality of the measurement image in a short time is required.

The invention relates to a charged particle beam device including a noise determination unit. A noise targeted by the noise determination unit according to the invention includes two types: a noise which is a controller noise generated in the controller and a noise generated between the controller and a column of a device or other controllers. The noise generated in the controller causes a positional deviation of the measurement image acquired in the charged particle beam device; the noise generated between the controller of the charged particle beam device and the column of the device or between controllers causes a blur of the measurement image acquired in the charged particle beam device.

The invention focuses on the two types of noises which are a normal mode noise and a common mode noise of the controller, and an observation unit capable of detecting and transmitting the two types of noises is installed on each controller. The frequency characteristic of the normal mode noise and the common mode noise obtained by the observation unit are analyzed, so that a fundamental frequency, a higher harmonic wave frequency, and a frequency of a modulated noise generated by combining the normal mode and the common mode noise of each controller are calculated. Thus, among frequencies in a calculation result, a frequency that is the same as a peak frequency of a noise frequency characteristic superimposed on the measurement image can be determined to be the noise source.

Hereinafter, an example in which the noise determination unit of the invention is applied to an electron gun of a charged particle beam device will be described.

In all drawings for explaining embodiments, components having the same function are denoted by the same reference numerals, and a repetitive description thereof will be omitted in principle. Hereinafter, the embodiments of the invention will be described in detail with reference to the drawings.

However, the invention should not be construed as being limited to the description of the embodiments described below. It will be readily understood by those skilled in the art that the specific configuration may be modified without departing from the spirit or scope of the invention.

First Embodiment

FIG. 1 is an example of a diagram showing a charged particle beam device body 100 according to a first embodiment of the invention. The charged particle beam device body 100 includes an electron gun 1 that outputs a charged particle beam 3, a focusing lens 2 that focuses the charged particle beam 3, a deflection controller 11 that changes a direction of the charged particle beam 3 and controls a position where the charged particle beam 3 is irradiated to a sample 5, a blanking controller 10, an objective lens 4 that focuses the charged particle beam 3 again, the sample 5 that serves as a measurement target, and a detector 7 that detects a secondary charged particle 6 emitted from the sample 5 irradiated with the charged particle beam 3. Here, the above configuration of the charged particle beam device body 100 is an example, and there may be a plurality of types, numbers and installing positions for each lens or electron optical device according to a design method of an electron optical system.

FIG. 2 is a diagram showing a configuration of a charged particle beam device system 500 in which the charged particle beam device body 100 shown in FIG. 1 is combined with a control system unit 200 thereof, and a control method for the charged particle beam device body 100.

The electron gun 1 of the charged particle beam device body 100 outputs the charged particle beam 3 based on a potential and a current supplied from an electron gun power supply 21 of the control system unit 200. Electron optical devices, such as the focusing lens 2 that focuses and deflects an output charged particle beam, the blanking controller 10, the deflection controller 11, and the objective lens 4, are connected to controllers 22-1, 22-2 ... 22-N-1, 22-N of a control unit 20 that provides a control signal, respectively. Each of the controllers 22-1, 22-2 ... 22-N-1, 22-N of the control unit 20 outputs a signal that controls each of the electron optical devices corresponding to a control signal input from an overall control unit 23.

A controller power supply unit 25 of the control system unit 200 provides power necessary for operation of the controllers 22-1, 22-2 ... 22-N-1, 22-N of the control unit 20. Generally, a power supply voltage type required by the controllers -1, 22-2 ... 22-N-1, 22-N differs, and accordingly controller power supply units 25-1, 25-2 ... 25-N-1, 25-N generate different voltages and supply power to the controllers 22-1, 22-2 ... 22-N-1, 22-N in the controller power supply unit 25.

A host PC 24 controls the entire charged particle beam device body 100, transmits a control signal of each electron optical device to the overall control unit 23, forms a measurement image by an image processing unit 26 to be described below based on a signal output from the detector 7 that detects the secondary charged particle 6 emitted from the sample 5 irradiated with the charged particle beam 3, and transmits the measurement image to a device monitor 27.

FIG. 3 shows types of noises generated in the charged particle beam device system 500 in FIG. 2. The types of noises generated in the charged particle beam device system 500 include a normal mode noise and a common mode noise.

An example of the normal mode noise is shown as a noise-1 and a noise-2 in FIG. 3. The normal mode noise is closed by the controllers 22-1 and 22-2. The noise source is a disturbance superimposed on a cable connected to an inside of the controllers 22-1 and 22-2 or an electron optical device, and causes, on a surface of the sample 5, positional deviation of the charged particle beam 3 irradiated onto the sample 5 by fluctuating a voltage between electrodes of electron optical devices such as the blanking controller 10 or the deflection controller 11.

A noise-3, a noise-4 and a noise-5 in FIG. 3 are examples of the common mode noise. The common mode noise is a fluctuation of a voltage generated between the controllers 22-1 and 22-2 or between the controllers 22-1 and 22-2 and a column 8, that is, a fluctuation of a reference potential of the controllers or the column. The electron gun 1 outputs the charged particle beam 3 based on potential output by the electron gun power supply 21, and the electron gun power supply 21 generates an output potential based on a grounding position 211 to be grounded (earthed).

On the other hand, the controllers 22-1 and 22-2 of the control unit 20 operate based on a potential provided by the controller power supply unit 25 that supplies power. The controller power supply unit 25 is grounded to earth at a connected grounding position 251. The column 8 is also grounded to earth at a connected grounding position 81.

Here, each of grounding positions 211, 251 and 81 are spatially separated at a distance because of the size of the charged particle beam device body 100, and a disturbance or a flowing return current are different. Accordingly, the potential is fluctuated at a different frequency component and level. For example, when there is the common mode noise between an electrode of the deflection controller 11 which is an electron optical device and the column 8, a focal length of the charged particle beam 3 changes since an electric field distribution changes, and a blur is generated in the measurement image obtained from a signal detected by the detector 7.

As described above, the normal mode noise and the common mode noise differ in types of image quality deterioration given to the measurement image. Further, since a frequency component of a control signal applied from the controller power supply unit 25 differs for each electron optical device, the noise superimposed on the measurement image contains a higher harmonic wave frequency or a modulated frequency in addition to a fundamental frequency component of the noise.

FIG. 4 shows the noise determination unit according to the first embodiment of the invention. The noise determination unit includes observation transmitting units 41-1, 41-2 . . . 41-N-1, and 41-N installed respectively on the controllers 22-1, 22-2 . . . 22-N-1, and 22-N of the control unit 20, a monitor unit 42, an observed signal frequency conversion processing unit 43, a measurement image frequency conversion processing unit 44, and a frequency analysis and comparison processing unit 45. The observed signal frequency conversion processing unit 43, the measurement image frequency conversion processing unit 44, and the frequency analysis and comparison processing unit 45 are incorporated as hardware or software inside the host PC 24.

The observation transmitting units 41-1, 41-2 . . . 41-N-1, and 41-N output a reference potential and the normal mode noise of the controllers 22-1, 22-2 . . . 22-N-1, and 22-N to the monitor unit 42 as a normal signal and a common signal.

The monitor unit 42 receives the normal signal and the common signal output from the observation transmitting units 41-1, 41-2 . . . 41-N-1, and 41-N and transfers the normal signal and the common signal to the observed signal frequency conversion processing unit 43. Here, the reference potential of the monitor unit 42 is a reference of the entire charged particle beam device system 500, and is grounded to a reference potential of the electron gun power supply 21 at, for example, the grounding position 211.

The observed signal frequency conversion processing unit 43 calculates a frequency component of the normal signal and the common signal input by each of the controllers 22-1, 22-2 . . . 22-N-1, and 22-N.

On the other hand, the measurement image frequency conversion processing unit 44 calculates a frequency component of a noise superimposed from the measurement image output from the detector 7 by using, for example, a method disclosed in PTL 1.

The frequency analysis and comparison processing unit 45 calculates a higher harmonic wave and a modulated wave component of a frequency component having a peak based on a result of the observed signal frequency conversion processing unit 43, performs comparison with a peak frequency component in a result of the measurement image frequency conversion processing unit 44, and outputs a matched frequency component as a result.

In addition, the image processing unit 26 is installed inside the host PC 24. The image processing unit 26 receives a signal of detecting the secondary charged particles 6 output from the detector 7 and a signal of controlling an electron optical device such as the blanking controller 10 or the deflection controller 11 via the controllers 22-1, 22-2 . . . 22-N-1, and 2-N of the control unit 20 from the overall control unit 23, and generates an image of the surface of the sample 5. The image generated by the image processing unit 26 is stored in a storage unit (not shown) inside the host PC 24, and meanwhile is displayed on a screen of the device monitor 27.

FIG. 5 shows an example of the monitor unit 42 and the control unit 20 including the controllers 22-1 . . . 22-N including the observation transmitting units 41-1 . . . 41-N according to the first embodiment.

The observation transmitting unit 41 (representing the observation transmitting units 41-1 . . . 41-N and described as the observation transmitting unit 41) includes a differential amplifier 51, an amplifier 52, a common choke filter 53, and a terminal resistor 541. A reference potential (GND-1) of the controller 22 (representing the controllers 22-1 . . . 22-N and described as the controller 22) and the signal output to the electron optical devices are connected to input terminals 511 and 512 of the differential amplifier 51. An output terminal 513 is connected to the common choke filter 53 via the terminal resistor 541. An output of the common choke filter 53 is connected to the monitor unit 42 via cables 531 and 532.

The reference potential (GND-1) of the controller 22 is connected to an input terminal 521 of the amplifier 52 of the observation transmitting unit 41, and an output of the amplifier 52 is connected to the monitor unit 42 via a terminal resistor 542 and a cable 533.

With such a configuration, a voltage signal between output terminals 5301 and 5302 of the common choke filter amplifier 53 is a normal signal, and an output potential signal of the amplifier 52 is a common signal.

The monitor unit 42 includes an AD conversion unit 59 that includes a plurality of AD converters and observation receiving units 55-1 . . . 55-N (hereinafter, referred to as an observation receiving unit 55). The observation receiving unit 55 is installed on the monitor unit 42 at the same number as the controller 22. Further, the monitor unit 42 is grounded to a potential that serves as the reference of the entire charged particle beam device system 500, for example the reference potential GND of the electron gun power supply 21.

The observation receiving unit 55 includes a differential amplifier 56, an amplifier 57, and input terminal resistors 581 and 582. The differential amplifier 56 receives the normal signal output from the output terminals 5301 and 5302 of the common choke filter 53 of the observation transmitting unit 41 and outputs the normal signal to the AD conversion unit 59.

The amplifier 57 detects a voltage between the common signal output from the amplifier 52 of the observation transmitting unit 41 and the reference potential (GND) of the motor unit 42, and outputs the voltage to the AD conversion unit 59. The AD conversion unit 59 converts output signals of the input differential amplifier 56 and the amplifier 57 into digital values respectively and then outputs the digital values to the observed signal frequency conversion processing unit 43.

FIG. 6 shows a method of comparing an observed noise and the superimposed noise of the measurement image. This calculation processing is executed by, for example, the observed signal frequency conversion processing unit 43, the measurement image frequency conversion processing unit 44, and the frequency analysis and comparison processing unit 45 inside the host PC 24.

First, in step S61, in the observed signal frequency conversion processing unit 43, a difference between a differential signal P: 561 and a differential signal N: 562 which are output signals of the differential amplifier 56 is calculated to be a normal mode signal. Further, a single signal which is an output signal of the amplifier 57 is a common mode signal.

In step S62, the normal mode signal and the common mode signal are frequency converted using a method such as FFT or wavelet conversion. In step S63, a peak frequency component of a frequency characteristic of the obtained normal mode signal and common mode signal is stored.

In step S64, steps S61 to S63 are executed for all output signals of the observation receiving unit 55 installed on the monitor unit 42.

FIG. 7 shows an example of the peak frequency characteristic obtained in the processing till step S64. As shown in each graph showing a relationship between a peak frequency component (Freq.) and a signal strength (DB) thereof in FIG. 7, results of the peak frequency characteristic are classified and stored respectively for an observation receiving unit number 701, a normal mode signal frequency characteristic 702, and a common mode signal frequency characteristic 703.

In step S65, a higher harmonic wave frequency component and a modulated wave frequency component generated from all peak frequency components such as stored F1$n$_1, F1$n$_2, F1$c$_1, F1$c$_2 are calculated. Here, the modulated frequency component is acquired by multiplication (mixed operation) of signals of two or more observed peak frequency components.

On the other hand, in step S66, a peak frequency of a disturbance frequency characteristic of the measurement image is acquired from the output signal of the detector 7 that detects the secondary charged particle 6 in the measurement image frequency conversion processing unit 44.

Next, in step S67, a high frequency component and the modulated wavelength frequency component which are calculated in the observed signal frequency conversion processing unit 43 in step S65 and peak frequency data of the disturbance frequency characteristic which is acquired in the measurement image frequency conversion processing unit 44 in step S66 are respectively input into the frequency analysis and comparison processing unit 45. The high frequency component and the modulated wavelength frequency component are compared with the peak frequency of the disturbance frequency characteristic to acquire a matched frequency.

Next, in step S68, the matched frequency component and a number (55-1 . . . 55-N) and a mode type of the observation receiving unit having the frequency component are output to the device monitor 27, and are displayed on a screen of the device monitor 27 in step S69. Here, the mode type is a type of the normal mode signal and the common mode signal, a fundamental wave, a higher harmonic wave and a modulated wave thereof.

FIG. 8 shows an example of a noise source characteristic result. FIG. 8 shows an example in which a graph 810 showing a disturbance frequency characteristic of the measurement image and a frequency comparison result list 820 are displayed on a screen 800. A peak frequency component 821: F1 to F4 of the noise superimposed on the measurement image, a controller number 822 that matches with the peak frequency component 821, an observed signal peak frequency 823, and a mode type 824 are displayed correspondingly in the frequency comparison result list 820.

The present embodiment is not limited to above-mentioned matters, and information displayed in the frequency comparison result list 820 in FIG. 8 may be directly displayed, for example, near the peak frequency of a graph of the frequency characteristic in FIG. 7. Further, the graph 810 showing the disturbance frequency characteristic of the measurement image in FIG. 8 may be displayed in a superimposed manner on each graph in FIG. 7.

Further, the information displayed in the frequency comparison result list 820 may be directly displayed near each peak frequency in the graph 810 showing the disturbance frequency characteristic of the measurement image on the screen 800 shown in FIG. 8.

Further, on the screen 800 shown in FIG. 8, instead of simultaneously displaying the graph 810 showing the disturbance frequency characteristic of the image and the frequency comparison result list 820, the information of the frequency comparison result list 820 corresponding to a specified frequency on the graph 810 showing the disturbance frequency characteristic of the measurement image may be displayed individually.

From the above, according to the present embodiment, a corresponding relationship between a noise frequency of the controller and a noise frequency superimposed on the measurement image can be determined, and device adjusting time can be shortened and maintainability can be improved by displaying the corresponding relationship on a screen.

As a result, determination of the noise source, measures for reducing the noise, and confirmation of a noise reducing result can be executed in a relatively short time, and an image processed by the image processing unit 26 is a relatively clear image with few noise.

Second Embodiment

In the first embodiment, as shown in FIG. 5, three cables 531 to 533 are used to transmit a signal between the observation transmitting unit 41 and the observation receiving unit 55. Since the monitor unit 42 on which the observation receiving unit 55 is installed is grounded to a reference potential of the electron gun power supply 21, the observation transmitting unit 41 is generally separated from the observation receiving unit 55 at a distance, and a cable length of the three cables 531 to 533 is large. Accordingly, as shown in FIG. 9, a disturbance is likely to superimpose on the cables 531 to 533, and detection precision of a noise is deteriorated.

The present embodiment provides a method to detect the noise with high accuracy by removing a disturbance superimposed on the cables 531 to 533. Configurations of the control unit 20 and the monitor unit 42 in this embodiment are the same as configurations shown in FIG. 5 in the first embodiment.

A configuration of a host PC 241 in the embodiment corresponding to the host PC 24 in the first embodiment is shown in FIG. 10. The host PC 241 in the embodiment includes an observed signal frequency conversion processing unit 431, a measurement image frequency conversion processing unit 441, a frequency analysis and comparison processing unit 451, and the image processing unit 26.

FIG. 11 shows a method of removing the disturbance superimposed on the cables 531 to 533 and comparing a frequency component of a normal mode noise and a common mode noise of the controller 22 with a frequency component of a noise superimposed on a measurement image with reference to the configuration shown in FIG. 5 in the first embodiment. The processing is executed by the observed signal frequency conversion processing unit 431, the measurement image frequency conversion processing unit 441, and the frequency analysis and comparison processing unit 451 inside the host PC 241.

First, in step S111, in the observed signal frequency conversion processing unit 431 corresponding to the observed signal frequency conversion processing unit 43 in the first embodiment, a difference between the differential signal P: 561 and the differential signal N: 562 which are output signals of the differential amplifier 56 shown in FIG. 5 is calculated to obtain a normal mode signal.

Here, the normal signal is a differential signal and is cable transmitted, and the disturbance superimposed during transmission becomes a common noise in cable transmission. Accordingly, the disturbance can be removed by differential receiving. Further, a disturbance signal is acquired by adding the differential signal P: 561 and the differential signal N: 562 for the same reason. In addition, a single signal 571 which is an output signal of the amplifier 57 is a common mode signal. The common mode signal is a signal in which a disturbance signal is superimposed on a common signal output by the observation transmitting unit 41.

In step S112, in the observed signal frequency conversion processing unit 431, frequency conversion processing of the normal mode signal, the disturbance signal, and the common mode signal obtained in the previous step S111 is executed, and a frequency characteristic of the common mode signal from which the disturbance signal is removed can be obtained by subtracting a frequency component of the disturbance signal from a frequency component of the common mode signal.

Hereinafter, steps from S113 to S119 are executed in the same manner as the steps from S63 to S69 in FIG. 6 in the first embodiment. Accordingly, a corresponding relationship between the noise frequency of the controller 22 of the control unit 20 and a noise frequency superimposed on the measurement image obtained through a detection signal from the detector 7 can be determined.

FIGS. 12A to 12G show a result of analyzing processing in steps S111 and S112. In this analysis, a common noise 121 having a characteristic as shown in FIG. 12A and a normal mode noise 122 having a characteristic as shown in FIG. 12B are applied to the controller 22, and characteristics of the two noises are transmitted by the observation transmitting unit 41. A disturbance noise 123 having a characteristic as shown in FIG. 12C is superimposed on the cables 531 to 533.

At this time, in step S111, a normal mode signal 124 having a characteristic shown in FIG. 12D as the normal mode signal, a disturbance signal 125 having a characteristic shown in FIG. 12E as the disturbance signal, a common mode signal waveform 126 having a characteristic shown in FIG. 12F as the common mode signal are obtained.

From the normal mode noise 122 having the characteristic shown in FIG. 12B and the normal mode signal 124 having the characteristic shown in FIG. 12D, it is confirmed that the normal mode signal can be observed without being influenced by the disturbance.

Further, the frequency component of the disturbance signal can be acquired from the disturbance noise 123 having the characteristic shown in FIG. 12C and the disturbance signal 125 having the characteristic shown in FIG. 12E. Further, it can be confirmed from the common mode signal waveform 126 having the characteristic shown in FIG. 12F that a disturbance signal 126-2 is superimposed on a common mode signal 126-1.

Next, the disturbance signal 126-2 is removed from the common mode signal waveform 126 shown in FIG. 12F by executing step S112, and it can be confirmed that the disturbance signal 126-2 superimposed on the common mode signal 126-1 in FIG. 12F can be removed by obtaining a common mode signal waveform 127 from which the disturbance is removed as shown in FIG. 12G.

From the above, the disturbance signal superimposed on the cables can be removed and the noise can be detected with high accuracy.

According to the embodiment, the corresponding relationship between the noise frequency of the controller and the noise frequency superimposed on the measurement image can be determined without being disturbed by the disturbance signal, and the device adjusting time can be shortened and the maintainability can be improved by displaying the corresponding relationship on the screen.

As a result, determination of the noise source, measures for reducing the noise, and confirmation of a noise reducing result can be executed accurately and in a relatively short time, and an image processed by the image processing unit 26 is a relatively clear image with few noise.

REFERENCE SIGN LIST

1 electron gun
2 focusing lens
3 charged particle beam
4 objective lens
5 sample
6 secondary charged particle
7 detector
8 column
10 blanking controller
11 deflection controller
20 control unit
21 electron gun power supply
22 controller
23 overall control unit
24, 241 host PC
25 controller power supply unit
26 image processing unit
27 device monitor
41 observation transmitting unit
42 monitor unit
43, 431 observed signal frequency conversion processing unit
44, 441 measurement image frequency conversion processing unit
45, 451 frequency analysis and comparison processing unit
51, 56 differential amplifier
52, 57 amplifier
53 common choke filter
55 observation receiving unit
59 AD conversion unit
100 charged particle beam device body
200 control system unit
500 charged particle beam device system

The invention claimed is:

1. A charged particle beam device including a unit that extracts information regarding a noise source, wherein the unit that extracts information regarding a noise source includes:
a control signal monitoring unit that observes a control signal of a control unit which controls an electron optical system of the charged particle beam device and outputs the observed signal;
a first frequency conversion processing unit that executes frequency conversion processing on the signal output from the control signal monitoring unit;
a second frequency conversion processing unit that executes frequency conversion processing on an image signal output from a detector of the electron optical system of the charged particle beam device; and
a frequency analysis and comparison processing unit that receives an output signal of the first frequency conversion processing unit and an image signal of the second frequency conversion processing unit, and associate a peak frequency of a superimposed noise of the image signal with a noise source of the control unit which generates a noise having a peak frequency corresponding to the peak frequency of the superimposed noise within the image signal.

2. The charged particle beam device according to claim 1, wherein
the control signal monitoring unit includes: an observation transmitting unit that observes the control signal of the control unit which controls the electron optical system of the charged particle beam device and transmits the observed signal; and an observation receiving unit that receives the observed signal by observing the control signal of the control unit output from the observation transmitting unit and outputs the signal to the first frequency conversion processing unit.

3. The charged particle beam device according to claim 2, wherein
the control signal monitoring unit includes the observation transmitting unit and the observation receiving unit in each of the control unit that controls the electron optical system of the charged particle beam device.

4. The charged particle beam device according to claim 1, further comprising:
an output unit that displays, on a screen, a result of associating the noise source of the control unit with the superimposed noise within the image signal by the frequency analysis and comparison processing unit, wherein
the output unit associates and displays the peak frequency of the superimposed noise of the image signal with information that determines the control unit that controls the electronic optical system on the screen.

5. The charged particle beam device according to claim 4, wherein
the output unit displays, on the screen, information regarding a mode type of the noise having the peak frequency corresponding to the peak frequency of the superimposed noise within the image signal generated from the noise source of the control unit.

6. A charged particle beam device noise source determination method for extracting information regarding a noise source of a charged particle beam device, the method comprising:
observing a control signal of a control unit that controls an electron optical system of the charged particle beam device;
executing frequency conversion processing on the observed signal by a first frequency conversion processing unit;
executing frequency conversion processing on an image signal output from a detector of the electron optical system of the charged particle beam device by a second frequency conversion processing unit; and
receiving a result of the frequency conversion processing executed by the first frequency conversion processing unit and a result of the frequency conversion processing executed by the second frequency conversion processing unit, and associating a peak frequency of a superimposed noise of the image signal with a noise source of the control unit which generates a noise having a peak frequency corresponding to the peak frequency of the superimposed noise within the image signal by the frequency analysis and comparison processing unit.

7. The charged particle beam device noise source determination method according to claim 6, wherein
the observation of the control signal of the control unit is executed by observing the control signal of the control unit that controls the electron optical system of the charged particle beam device and transmitting the observed signal by an observation transmitting unit, and receiving the observed signal by observing the control signal of the control unit transmitted from the observation transmitting unit and outputting the signal to the first frequency conversion processing unit by an observation receiving unit.

8. The charged particle beam device noise source determination method according to claim 7, wherein
the observation of the control signal of the control unit is executed in each of the control unit that controls the electron optical system of the device.

9. The charged particle beam device noise source determination method according to claim 6, further comprising:
displaying, on a screen, a result of associating the noise source of the control unit with the superimposed noise of the image signal by the frequency analysis and comparison processing unit, and associating and displaying a frequency characteristic of the superimposed noise of the image signal with information which determines the control unit that controls the electronic optical system on the screen.

10. The charged particle beam device noise source determination method according to claim 9, wherein
information regarding a mode type of the noise having the peak frequency corresponding to the peak frequency of the superimposed noise within the image signal that is generated from the noise source of the control unit is displayed on the screen.

* * * * *